United States Patent
Centola et al.

(10) Patent No.: US 6,633,490 B2
(45) Date of Patent: Oct. 14, 2003

(54) ELECTRONIC BOARD ASSEMBLY INCLUDING TWO ELEMENTARY BOARDS EACH CARRYING CONNECTORS ON AN EDGE THEREOF

(75) Inventors: Bruno Centola, Vence (FR); Claude Gomez, Antibes (FR); Christian Ouazana, St Laurent du Var (FR)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/016,445

(22) Filed: Dec. 10, 2001

(65) Prior Publication Data

US 2002/0071260 A1 Jun. 13, 2002

(30) Foreign Application Priority Data

Dec. 13, 2000 (EP) .............................. 00480118

(51) Int. Cl.$^7$ ................................. H05K 7/10
(52) U.S. Cl. .................. 361/785; 361/788; 361/791; 361/792; 361/795; 439/65; 439/79; 174/259; 174/267
(58) Field of Search ................................. 361/742, 744, 361/785, 788, 790, 791, 792, 795, 803, 804; 439/65, 66, 79, 80, 82, 91; 174/258, 259, 267

(56) References Cited

U.S. PATENT DOCUMENTS 3,334,325 A * 8/1967 Conrad et al. ................ 439/60
3,746,932 A * 7/1973 Hogan et al. ................ 361/785
5,004,427 A * 4/1991 Lindeman .................... 439/101
5,051,099 A * 9/1991 Pickles et al. ............... 439/108
5,090,912 A * 2/1992 Zell ............................. 439/79
5,384,434 A * 1/1995 Mandai et al. ............... 174/258
5,397,241 A * 3/1995 Cox et al. ...................... 439/79
5,522,727 A * 6/1996 Saito et al. .................... 439/65
6,021,050 A * 2/2000 Ehman et al. ............... 361/793
6,121,553 A * 9/2000 Shinada et al. .............. 174/259
6,322,372 B1 * 11/2001 Sato ............................. 439/65

* cited by examiner

Primary Examiner—John B. Vigushin
(74) Attorney, Agent, or Firm—Lawrence R. Fraley

(57) ABSTRACT

An electronic board assembly carrying connectors on each side of its lower edge which is adapted to withstand the relatively strong forces required to insert or remove the assembly, e.g., from a backplane board, and yet provide many electrical contacts along the interconnection sites. The electronic board assembly comprises two symmetrical elementary PCBs electrically coupled together, each carrying a connector on its external lower edge. In one embodiment, these two PCBs are coupled together by a flexible adhesive insulative layer and maintained by mechanical devices such that the distance between these two connectors is set to a predetermined distance (to align precisely with the backplane board). The mechanical device used to maintain a predetermined distance between the two connectors of the assembly may comprise a U-shaped member, the upper part of this member being strategically inserted between these connectors. Electrical communication between these PCBs is accomplished using conductive vias or parts, within the adhesive insulative layer.

15 Claims, 5 Drawing Sheets

ELECTRONIC BOARD ASSEMBLY INCLUDING TWO ELEMENTARY BOARDS EACH CARRYING CONNECTORS ON AN EDGE THEREOF

FIELD OF THE INVENTION

The present invention relates to the connection of electronic boards in a housing. More particularly, the invention relates to an electronic board carrying connectors to provide a high number of electrical contacts.

BACKGROUND OF THE INVENTION

As is known, printed circuit boards (PCBs) are a common form of electrical circuit packaging. Today, many electrical systems like computers, routers and switchers are based on a housing containing a backplane circuit board comprising active devices and at least one slot (usually more) to connect an electronic board. Electronic boards are linked to the backplane with connectors, located on the electronic board lower edge and backplane surface, through which signals are transmitted. These connectors are required to some electrical and mechanical requirements: (1) signals must be transmitted efficiently, e.g. without deformation and at high speed; and (2) these connectors must be able to be inserted or extracted easily and must be retained so that electrical connections are not disturbed. Several techniques are known to couple connectors to electronic boards and to backplane boards. Typically, the connector may comprise external pins that go through the board and are welded (soldered) on the other side. The connector may also be soldered on the board surface, e.g. using a known component surface mounting technique, or the connector may be held in place with the use of external and/or flexible pins that go through the board but are not required to be soldered (e.g., on the other side). This last coupling system, referred to as press-fit, is commonly used since it reduces manufacturing cost.

In order to meet miniaturization and increased density design requirements, the electronic packaging industry is requiring a dramatic increase of the number of Input/Output (I/O) contacts (pins and sockets) used in such connecting structures. Progress in the field of the Information Technology (IT) equipment has resulted in electronic boards with improved impedance, better dielectric (e.g., PTFE) insulators, and improved mechanical strength and geometry. However, meeting such requirements are making the mechanical packaging of these structures more costly from both a development and manufacturing standpoint. Additionally, such relatively complex structures make the installation and the removal of logic boards from the backplane a sometimes difficult job. Still further, as the number of electrical contacts increases, the force required to insert or extract an electronic board from a housing understandably increases correspondingly.

FIG. 1, showing a conventional backplane 100 equipped with a first connector 110 and a larger, second connector 115 mounted on an electronic board (printed circuit board, or PCB) 105, illustrates the force 120 exerted to insert or extract PCB 105. This force is not applied directly on the connector for practical reason, e.g., the connector 115 is carried both on the lower edge of the electronic board, and also on the face thereof. Consequently, because of the connector width and the mechanical resistance of the electrical contacts, force 120 produces vertical force 125, rotational force 130 and lateral force 135 that help separate connector 115 and electronic board 105 from the backplane. Furthermore, these forces, asymmetrically distributed upon PCB 105, may cause damage to the electronic board or the electronic devices (not shown) positioned on its surfaces. To remove this risk, the separation force must be applied symmetrically on PCB 105 and also on the electrical contacts positioned on the side of the PCB adjacent its soldered lower edge. Obviously, connectors with pins that go through the PCB, e.g., soldered pin or press-fit connector, cannot be used since this may result in electrical shorts between connectors.

FIG. 2 illustrates a known way to use symmetrical surface mounted connectors. This coupling system distributes the force on two connectors 115'-1 and 115'-2 to thus reduce the risk of damaging the PCB 105 and/or the devices mounted on its surfaces. Likewise, in comparison to FIG. 1, the smaller width of each of this pair of connectors reduces the risk of undesirable separation of connectors 115'-1/115'-2 from PCB 105. Nevertheless, while this FIG. 2 connecting system substantially prevents damaging the PCB and/or its positioned components, the use of connecting solders increases the chances for separation at these solders, which solders may break due to excessive shearing forces. As seen, connectors 115'-1 and 115'-2 do not include pins as does connector 115, to strongly hold both connectors to place during force application.

It is believed, therefore, that an electronic board assembly which overcomes the disadvantages of the aforementioned conventional assemblies would constitute a significant advancement in the art.

OBJECTS AND SUMMARY OF THE INVENTION

It is an object of the invention to enhance the electronic board assembly art.

It is another object of the invention to provide an electronic board assembly which carries connectors on each side thereof that can withstand the relatively strong forces required to insert or extract a board.

It is a further object of the invention to provide such an assembly which can be produced in a relatively facile manner, thereby keeping the costs associated with such assemblies relatively low.

The accomplishment of these and other related objects is achieved by an electronic board assembly that comprises two elementary electronic boards, coupled together, each of said two elementary electronic boards carrying at least one connector on its external lower edge. At least one of these connector comprises external pins that go through the elementary electronic board carrying said at least one connector.

Further advantages of the present invention will become apparent to one skilled in the art upon examination of the drawings and detailed description provided herein.

BRIEF DESCRIPTION OF THE DRAWINGS

FIG. 3, comprising

For a better understanding of the present invention, together with other and further objects, advantages and capabilities thereof, reference is made to the following disclosure and appended claims in connection with the above-described drawings. It is understood that the numerals may be used to indicate like elements from FIG. to FIG.

BEST MODE FOR CARRYING OUT THE INVENTION

The preferred embodiment of the present invention is for use with electronic boards for routing or switching systems that typically require great numbers of electrical connections and high speed signal transmissions and wherein press-fit connectors are often used. Nevertheless, it is to be understood that the present invention can be used with various other kinds of electronic boards and connector combinations.

According to the invention, an electronic board assembly is the result of coupling two symmetrical electronic printed circuit boards (PCBs), referred to herein as elementary PCBs for sake of clarity. To facilitate this coupling operation, electronic devices (e.g., modules) are positioned (e.g., soldered) on only one surface of each elementary PCB or embedded inside the thickness thereof.

Figure 2:
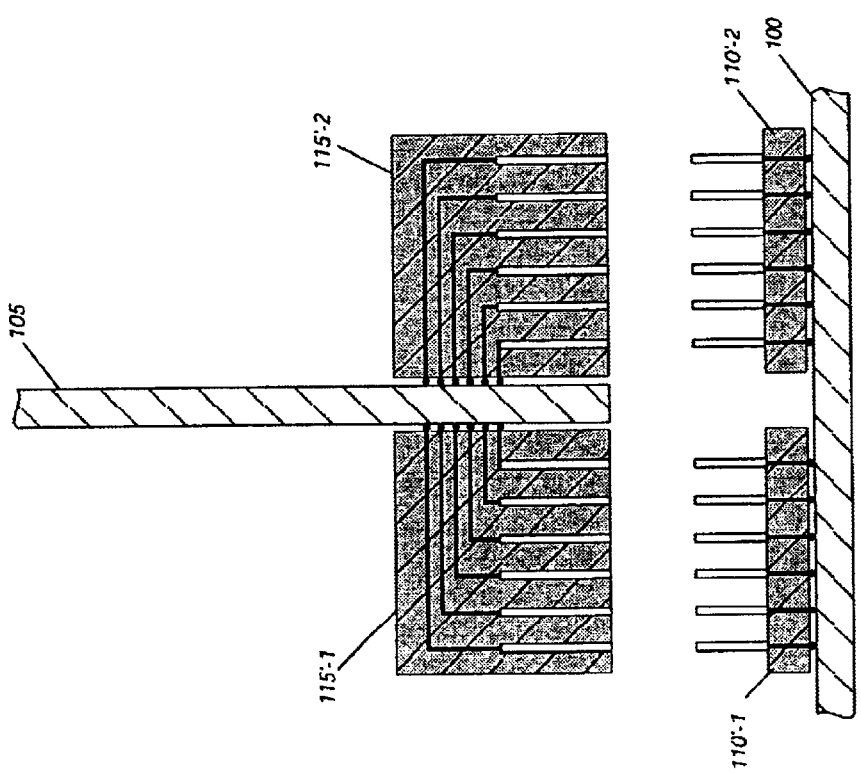
FIG. 2 describes a second conventional connecting system, comprising two connectors carried on the two lower sides of a PCB, that include as many electrical contacts as the connector depicted on FIG. 1.
Figure 1:
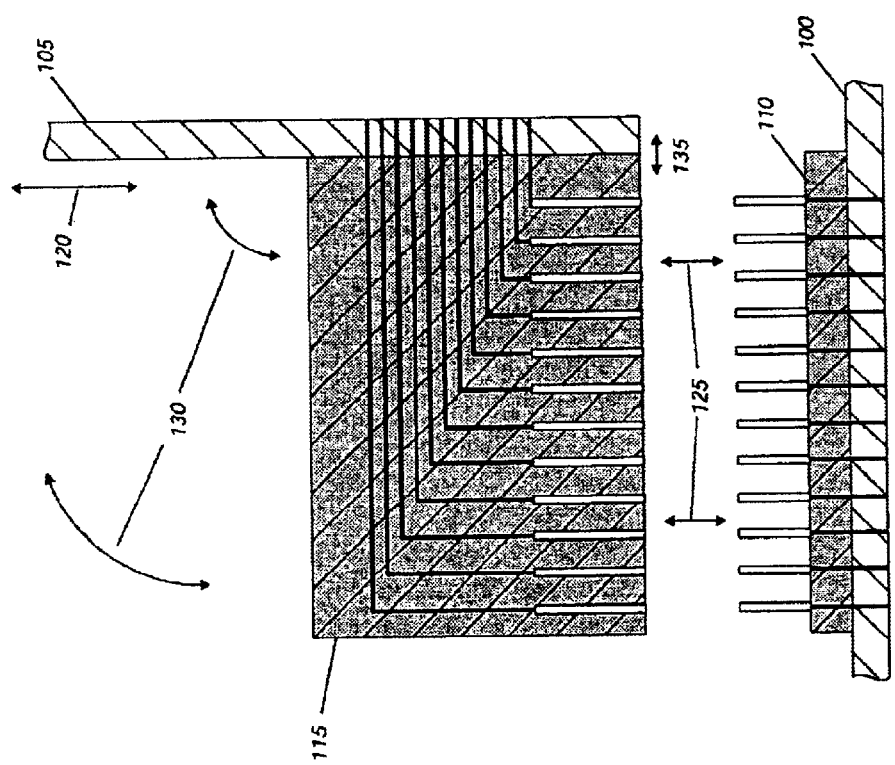
FIG. 1 shows a first conventional connecting system, comprising a large connector that includes many electrical contacts, mounted on the PCB using pins.
Figure 3B:
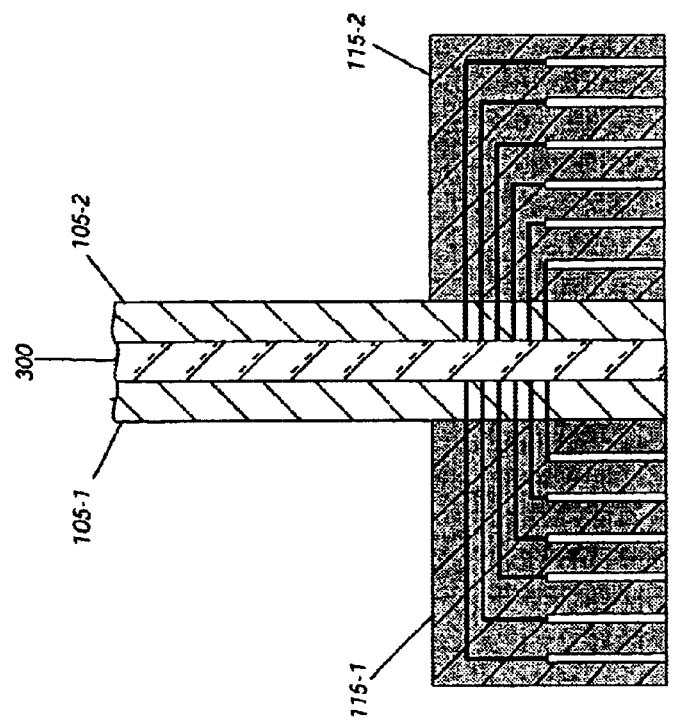
FIGS. 3a and 3b, illustrates a connecting system according to one embodiment of the invention, this invention having two symmetrical PCBs, each PCB carrying a connector.
Figure 3A:
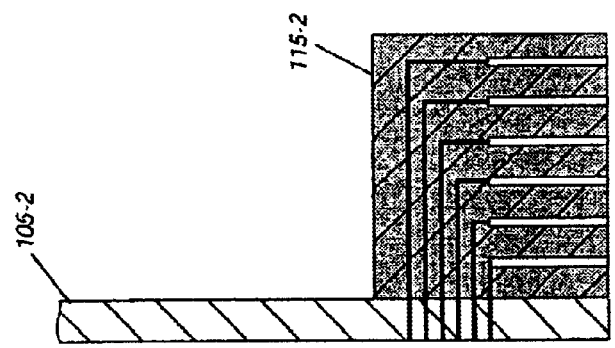

FIG. 3a illustrates two elementary PCBs 105-1 and 105-2 wherein connectors 115-1 and 115-2 are symmetrically disposed, respectively, along each elementary PCBs external lower edge. To provide a firm connection between each elementary PCB and its associated connector, each connector includes pins that go through the respective elementary PCB. These may be welded (soldered) on the other side of the elementary PCB or maintained by a flexible mechanism (not shown). As shown on FIG. 3b, the two elementary PCBs are coupled together to form an electronic board assembly that comprises the two symmetrical connectors carried on the assembly's lower surfaces (of each PCB). An electrically adhesive insulative layer 300 is used to couple elementary PCBs 105-1 and 105-2. Known adhesive materials may be used for layer 300.

Communication between the two elementary PCBs 105-1 and 105-2 is performed using electrical connections. These connections can be done either by conductive vias in layer 300 or by providing other conductive parts (e.g., pins) in the adhesive insulative layer 300.

Figure 4:
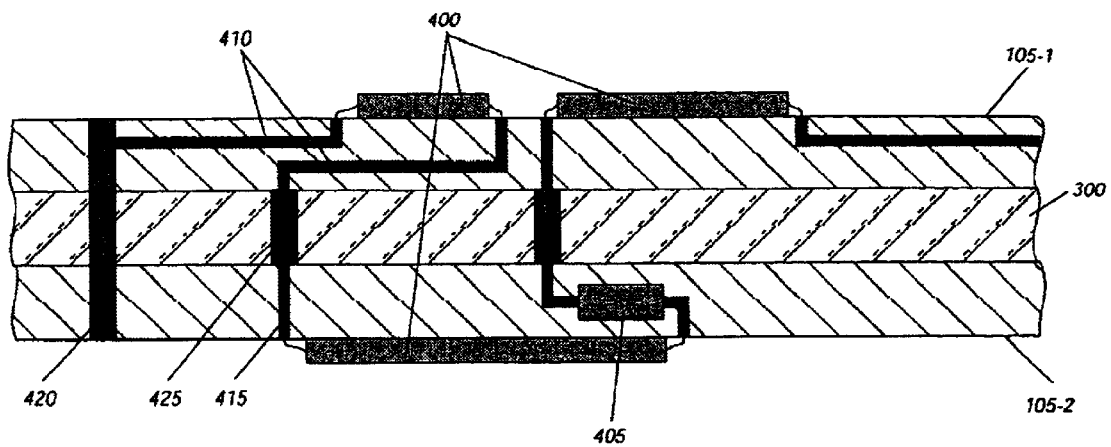
FIG. 4 is a detailed view of one embodiment of a coupling system of the two electronic boards according to the invention.

FIG. 4 is an example of the elementary PCBs coupling showing three electrical connections between the two boards. As stated above, PCBs 105-1 and 105-2 are secured together with the use of common adhesive insulative layer 300. Each PCB is also shown to include surface electronic devices 400 soldered on the respective PCB external surfaces. Devices 400 may be chip modules or other devices (e.g., resistors) known in the art. If devices 405 are resistors, capacitors and inductors, these devices may also be embedded within the elementary PCBs. PCBs 105-1 and 105-2 may be of conventional construction and comprise several internal copper (or other conductive material) layers 410 used to carry electrical signals. Electrical connection between these board layers are preferably done with microvias 415. Electrical signals may be transmitted from one elementary PCB to the other either by a larger conductive via 420 or by conductive vias or parts 425 located strategically within adhesive insulative layer 300. When using conductive vias such as 420, apertures may be drilled in the respective PCB after these boards have been coupled, using a conventional drilling operation. The use of conductive parts or vias 425 in the adhesive insulative layer allows the layer 300 to be used as an additional electronic board layer that can carry electrical signals, thus further enhancing the operational capabilities of the invention.

Figure 5:
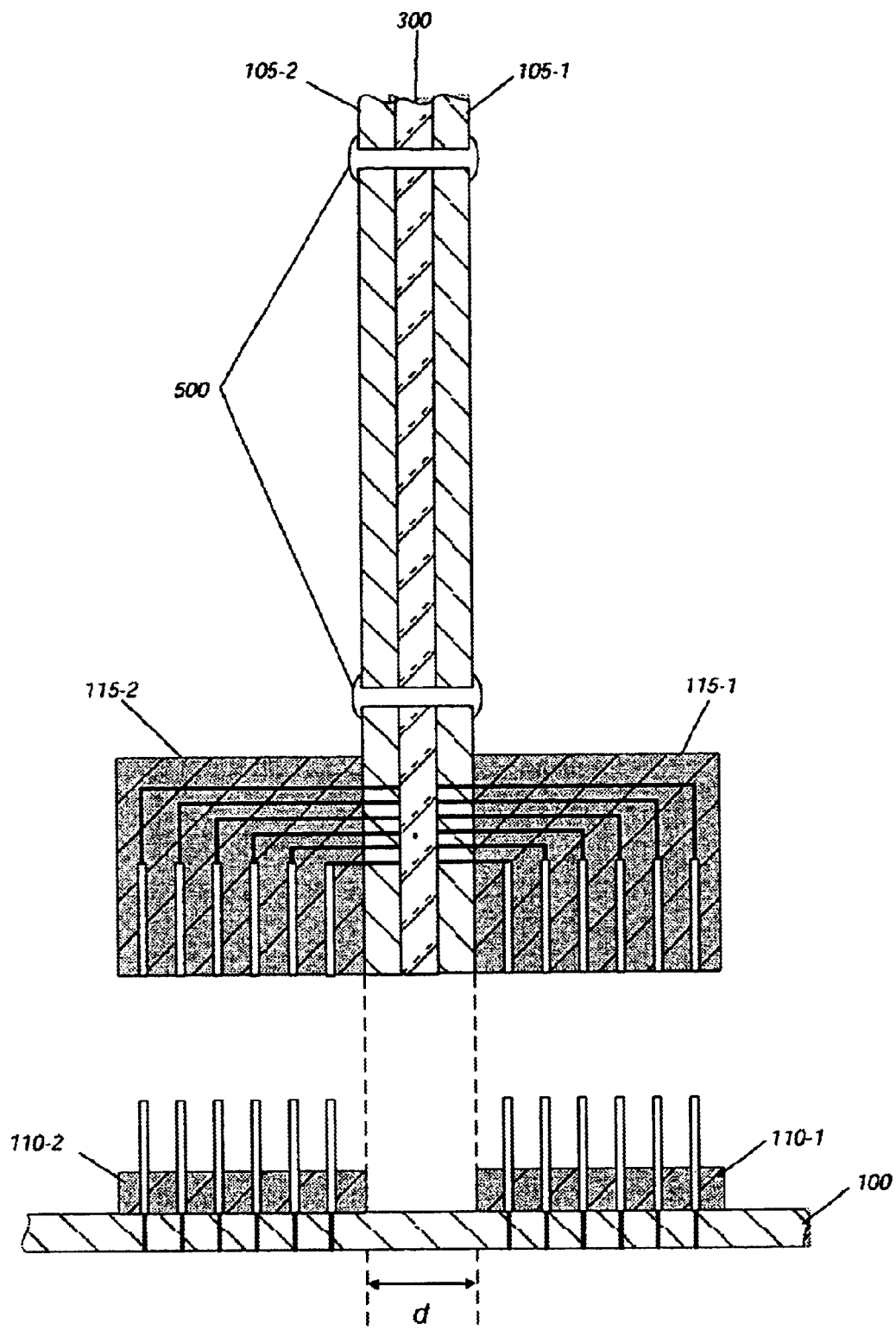
FIG. 5 illustrates one example of how to provide a predefined distance between the invention's two PCB connectors.

Standard multilayer circuit board manufacturing processes are not particularly adapted to assure a constant and precise distance between the two surfaces of these boards when aligned relative to one another as see in FIGS. 3–6. Using an assembly of the type taught herein wherein connectors preferably comprise many electrical connections and may in turn require relatively strong forces to be inserted or removed. This potential drawback may lead to damage of one or more electrical contacts since the two PCB connectors would in turn be slightly misaligned relative to the two corresponding male connectors coupled to the backplane on which the invention is to be positioned. Therefore, in a preferred embodiment of the invention, adhesive insulative layer 300 is flexible to accommodate varying distances between the two board surfaces and associated connectors. The electrical connections between the two elementary PCBs is, as stated, achieved using conductive vias or parts of the adhesive insulative layer as described above. For electrical contacts located within adhesive insulative layer 300, these conductive parts may also be flexible, e.g. conductive elastomers or springy contacts. The distance between the two connectors is preferably fixed by mechanical means such as screws or rivets that pass through the two elementary electronic boards as seen in FIG. 5. For electronic connections between the two boards using conductive vias, the vias are put in place after the distance between the two connectors is set, e.g. in a pressing machine.

FIG. 5 illustrates a backplane board 100 having thereon two male connectors 110-1 and 110-2 each adapted to mate the two female connectors 115-1 and 115-2 carried on the lower outer surfaces of the two elementary PCBs 105-1 and 105-2 respectively. Each connector 110-1 and 110-2 is shown as including a plurality (i.e., 6 each) of upstanding male pins, these pins aligning with and being inserted within corresponding female connection openings in connectors 115-1 and 115-2. As the distance "d" between the two connectors 110-1 and 110-2 is determined by the connector 110-1 and 110-2 locations in backplane 100, the corresponding distance between the connectors 115-1 and 115-2 is exactly the same. As mentioned above, standard electronic board making processes are not particularly adapted to assure a constant and precise distance between the two surfaces of two aligned boards. However, the use of flexible adhesive insulative layer 300 between the boards allows the assembly to be compressed after elementary electronic boards 105-1 and 105-2 have been coupled, to exactly fit the required dimensional separation. To further assist, apertures are drilled in the coupled PCBs to receive mechanical maintaining means 500, e.g. screws or rivets, that are put in place after the distance has been set to its correct value "d", e.g. in the pressing apparatus (not shown) used.

Figure 6:
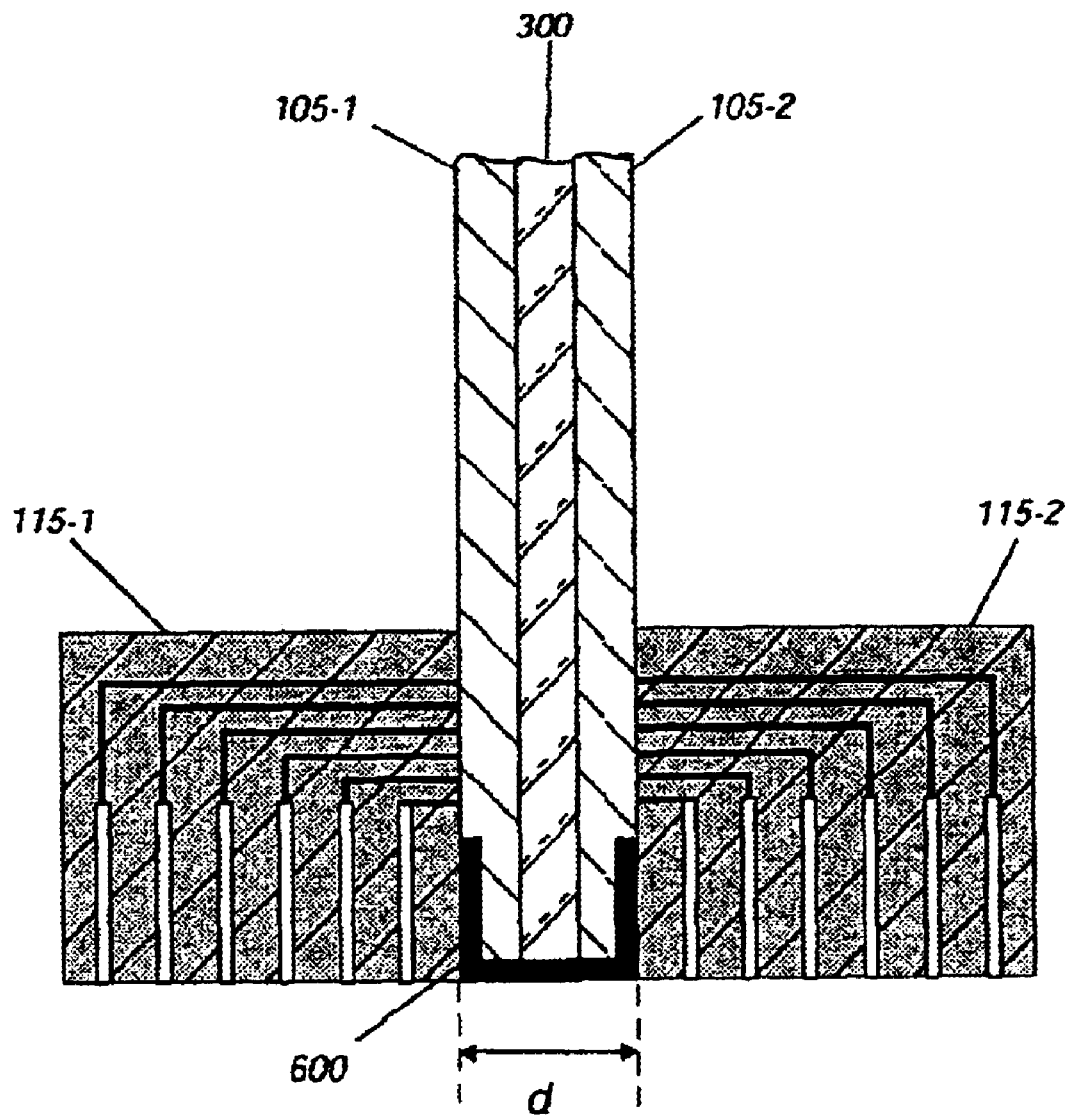
FIG. 6 illustrates another example of how to provide a predefined distance between the invention's two PCB connectors, this example assuring reduced electromagnetic emission on the lower edge of both PCBs as held together in accordance with the teachings herein.

FIG. 6 illustrates another form of a locking mechanism to assure a precise distance between connectors 115-1 and 115-2. This mechanism comprises a U-shaped member 600 that fits within grooves in the two elementary PCBs 105-1 and 105-2. The base width of the U-shaped member is equal to "d", if the FIG. 6 assembly is to be mounted on a backplane board such as the one shown in FIG. 5. The upper parts of the U-shaped member are inserted between the elementary PCBs and the associated connectors 115-1 and 115-2 to be located in the shown grooves in the elementary PCBs. It is understood that the base width of the U-shaped member may be greater than "d" if desired, e.g., by adding grooves instead in connectors 115-1 and 115-2 or alternatively, in both the boards and connectors. In a preferred embodiment, this U-shaped member is comprised of a conductive material and connected to the ground layers of the elementary PCBs so that it helps reduce electromagnetic emission from the lower edges of the PCBs.

While there have been shown and described what are at present the preferred embodiments of the invention, it will be obvious to those skilled in the art that various changes and modifications may be made therein without departing from the scope of the invention as defined by the appended claims.

What is claimed is:

1. An electronic board assembly comprising:
   first and second elementary printed circuit boards (PCBs) spacedly positioned apart from one another and each including a lower outer surface;
   first and second electrical connectors positioned on said lower outer surfaces of said first and second PCBs, respectively, at least one of said electrical connectors including external pins positioned within the respective one of said PCBs on which said at least one electrical connector is positioned; and
   an insulative layer located substantially between said first and second PCBs and in physical contact therewith, said insulative layer being flexible.

2. The electronic board assembly of claim 1 further comprising at least one conductive via within said insulative layer for transmitting electrical signals from one of said elementary PCBs to the other.

3. The electronic board assembly of claim 1 wherein said insulative layer includes at least one conductive part therein.

4. An electronic board assembly comprising:
   first and second elementary printed circuit boards (PCBs) spacedly positioned apart from one another and each including a lower outer surface;
   first and second electrical connectors positioned on said lower outer surfaces of said first and second PCBs, respectively, at least one of said electrical connectors including external pins positioned within the respective one of said PCBs on which said at least one electrical connector is positioned; and
   an insulative adhesive layer located substantially between said first and second PCBs and in physical contact therewith, said insulative layer being flexible.

5. The electronic board assembly of claim 4 further comprising at least one conductive via within said insulative layer for transmitting electrical signals from one of said elementary PCBs to the other.

6. The electronic board assembly of claim 4 wherein said insulative layer includes at least one conductive part therein.

7. An electronic board assembly comprising:
   first and second elementary printed circuit boards (PCBs) spacedly positioned apart from one another at a predetermined distance and each including a lower outer surface;
   first and second electrical connectors positioned on said lower outer surfaces of said first and second PCBs, respectively, at least one of said electrical connectors including external pins positioned within the respective one of said PCBs on which said at least one electrical connector is positioned;
   an insulative adhesive layer located substantially between said first and second PCBs and in physical contact therewith, said insulative layer being flexible; and
   at least one mechanical member for maintaining said first and second elementary PCBs spacedly apart said predetermined distance from one another.

8. The electronic board assembly of claim 7 wherein said at least one mechanical member comprises a U-shaped member positioned on the first and second electrical lower edge of each of said PCBs and having an upper part, said upper part of said U-shaped member being positioned substantially between said first and second electrical connectors carried by said two elementary PCBs.

9. The electronic board of claim 8 wherein said U-shaped member is comprised of conductive material to thereby reduce electromagnetic emissions from said PCBs.

10. The electronic board assembly of claim 7 further comprising at least one conductive via within said insulative layer for transmitting electrical signals from one of said elementary PCBs to the other.

11. The electronic board assembly of claim 7 wherein said insulative layer includes at least one conductive part therein.

12. An electronic board assembly comprising:
    first and second elementary printed circuit boards (PCBs) spacedly positioned apart from one another and each including a lower outer surface;
    first and second electrical connectors positioned on said lower outer surfaces of said first and second PCBs, respectively, at least one of said electrical connectors including external pins positioned within the respective one of said PCBs on which said at least one electrical connector is positioned;
    an insulative adhesive layer located substantially between said first and second PCBs and in physical contact therewith, said insulative layer being flexible; and
    a backplane PCB having first and second electrical connectors spacedly positioned thereon, said first and second electrical connectors on said PCBs being electrically coupled to said first and second electrical connectors of said backplane PCB, respectively.

13. The electronic board assembly of claim 12 wherein said first and second electrical connectors on said backplane PCB are male pin connectors and said first and second electrical connectors on said first and second PCBs are female connectors.

14. The electronic board assembly of claim 12 further comprising at least one conductive via within said insulative layer for transmitting electrical signals from one of said elementary PCBs to another.

15. The electronic board assembly of claim 12 wherein said insulative layer includes at least one conductive part therein.

* * * * *